United States Patent [19]

Gilman et al.

[11] Patent Number: 4,527,123
[45] Date of Patent: Jul. 2, 1985

[54] IMPROVED METHOD AND APPARATUS FOR DETECTING AND LOCATING RESIDUALLY MAGNETIZED ITEMS

[75] Inventors: Robert F. Gilman, Cotati; Claude R. Schwarz, Santa Rosa, both of Calif.

[73] Assignee: Sentronic of California Incorporated, Rohnert Park, Calif.

[21] Appl. No.: 166,840

[22] Filed: Jul. 8, 1980

[51] Int. Cl.³ .................. G01R 33/022; G01R 33/04
[52] U.S. Cl. ..................................... 324/254; 324/67; 324/260; 324/326
[58] Field of Search ........................... 324/253–255, 324/67, 345, 326–329, 207, 226, 260; 340/551

[56] References Cited

U.S. PATENT DOCUMENTS

| 2,321,356 | 6/1943 | Berman | 324/67 X |
| 3,445,928 | 5/1969 | Beynon | 324/254 X |
| 3,460,528 | 8/1969 | Carney | 324/226 X |
| 3,541,432 | 11/1970 | Scarbrough | 324/255 |
| 3,909,704 | 9/1975 | Schonstedt | 324/254 X |
| 4,068,164 | 1/1978 | Schwartz et al. | 340/551 X |
| 4,100,492 | 7/1978 | Forster | 324/254 |

Primary Examiner—Gerard R. Strecker
Attorney, Agent, or Firm—David B. Harrison

[57] ABSTRACT

Methods and apparatus for detecting and locating residually magnetized misplaced tools and the like are disclosed. A sensitive gradiometer having a hand-held probe provides a balanced, phase cancelling magnetic field. The presence of a weak residual mangetic field emanating from the misplaced tool upsets the balance of the generated field, and this imbalance provides an audio signal which is used to locate the tool.

7 Claims, 17 Drawing Figures

IMPROVED METHOD AND APPARATUS FOR DETECTING AND LOCATING RESIDUALLY MAGNETIZED ITEMS

BACKGROUND OF THE INVENTION

This invention relates to apparatus and methods for detecting misplaced items characterized by residual magnetic fields. More particularly, the present invention relates to a detection system including a portable gradiometer of improved design for indicating the proximity of an item such as a residually magnetized misplaced tool.

In some work and maintenance environments, such as ground maintenance of aircraft, the misplacement and loss of small items such as hand tools and the like may present grave hazards and sometimes result in damage or destruction of property and injury or loss of human life.

Magnetic tagging of items such as tools, has been proposed in the prior art in order to facilitate locating such items in the event they have been lost or misplaced. One prior approach was set forth in U.S. Pat. No. 3,587,583 to Greenberg, issued June 28, 1971. Therein, magnetized particles were secured to surgical sponges. Prior to the completion of an operation, the patient was scanned by a magnetodiode sensor apparatus to detect residual magnetic fields which would have indicated a lost or misplaced sponge.

Other prior art approaches were disclosed in U.S. Pat. No. 3,292,080 to Trikilis, issued Dec. 13, 1966 and entitled System and Method for Preventing Pilferage by Detection of Magnetic Fields., RCA Technical Notes, TN No. 675, June 1966 entitled "Intra-Uterine Device with Means for External Detection (permanent magnets)"; and Swiss Pat. No. 355,357 to Stollner, issued August 1961.

While those approaches acknowledged the utility of residual magnetic tagging of small items placed in or about the person, there was no teaching that this approach could be utilized in much larger work environments, particularly the ground maintenance environment associated with large aircraft.

One significant drawback of prior approaches was the unavailability heretofore of portable detection apparatus having sufficient sensitivity and directivity to detect and indicate low level residual magnetic fields at distances greater than a few inches away.

Another drawback of prior approaches was the absence of a portable detector having a hand held probe with known directional characteristics to facilitate pinpointing lost items in nonvisible locations, such as inside engine cowlings.

A further drawback of prior approaches was the need to provide the residual magnetism as part of the manufacturing process for items, such as surgical sponges, capable of being misplaced or lost.

OBJECTS AND SUMMARY OF THE INVENTION

Having in mind the drawbacks of the prior approaches, an object of the present invention is to provide an improved method and apparatus for detecting and locating residually magnetized tools and the like which overcomes those prior art drawbacks.

Another object of the present invention is to provide a portable apparatus having improved sensitivity to residual magnetic field gradients without undue circuit complexity and with readily available components and materials.

Another object of the present invention is to provide a portable apparatus including a hand held probe having known directional properties to facilitate locating of misplaced residually magnetized items after they have been detected.

A further object of the present invention is to provide a method for tagging tools and like items with residual magnetism at the job site and utilizing the residual magnetism to detect and locate any misplaced tools and items in a large area work environment, such as ground maintenance of e.g. jet propelled aircraft.

Yet another object of the present invention is to reduce foreign object damage hazards to aircraft and the like arising when tools and like items are not located and removed prior to flying operations. Portable apparatus for detecting and locating residually magnetized tools and the like which follows the principles of the present invention includes a magnetic probe and a field generator and detector in a housing to which the probe is connected by a cable.

The probe includes a plurality of ferromagnetic cores aligned with and spaced apart along a common axis.

A plurality of drive coils are connected in series to provide fields at the cores which are in polar alignment, and each drive coil is wound on a separate core.

The field generator is connected to the series connected drive coils and provides to each coil a time varying audio frequency drive current to generate the magnetic fields and a common field in polar alignment.

The probe also includes a plurality of pickup coils, each being wound as a secondary of a drive coil and connected in series in polar opposition so that voltages induced therein from excitation of the drive coils are substantially equal in magnitude and time and substantially opposite in polarity so as to be phase cancelling.

The detector is connected to the pickup coils and detects imbalances in phase cancellation induced in the pickup coils when the fields are disturbed by the presence of a weak residual magnetic field emanating from a residually magnetized tool or item to be located.

The method of the present invention for detecting and locating residually magnetized tools and the like, includes the steps of:

a. inducing a residual magnetic field in items such as hand tools which may become misplaced during usage, b. providing a balanced, time varying audio frequency electromagnetic field of known field characteristics, c. bringing the field into the vicinity of a misplaced residually magnetized item so that lines of force of its residual field upset the balance of the electromagnetic field, d. inducing non-cancelling voltage pulses in pickup coils as the field is upset, e. detecting the amplitude of the pulses as a relative indication of the direction and distance of the item to be located.

These and other objects, advantages and features will become apparent from the following detailed description of a preferred embodiment of the present invention presented with the accompanying drawing.

BRIEF DESCRIPTION OF THE DRAWINGS

In the drawings:

FIG. 10–FIG. 14 depict wave form diagrams at circuit locations within the pulse generator depicted in FIG. 4.

FIG. 15–FIG. 17 depict wave form diagrams at circuit locations within the detector depicted in FIG. 6.

DETAILED DESCRIPTION OF A PREFERRED EMBODIMENT

Figure 1:
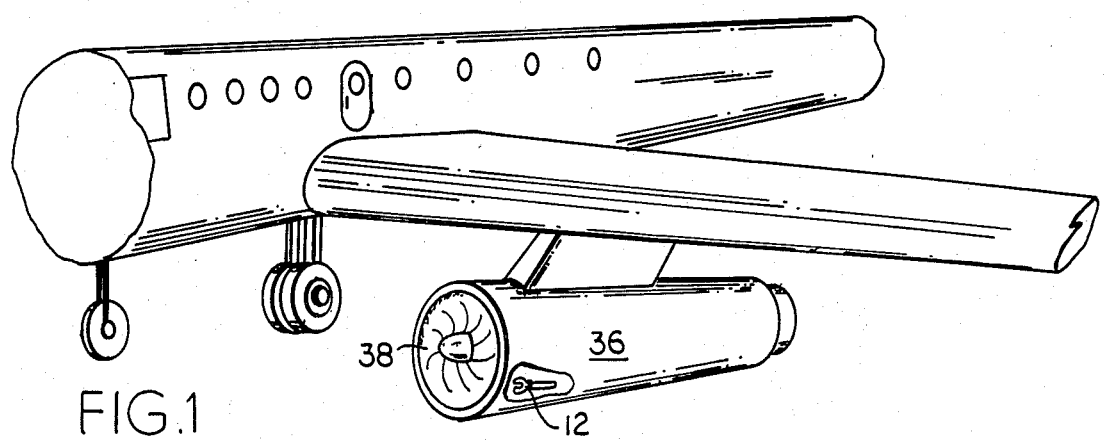
FIG. 1 depicts a portable gradiometer operating in a work environment to detect the misplaced tool in accordance with the principles of the present invention.
Figure 2:
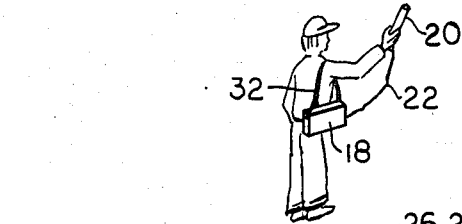
FIG. 2 depicts a hand tool undergoing initial magnetization in accordance with the principles of the present invention.
Figure 3:
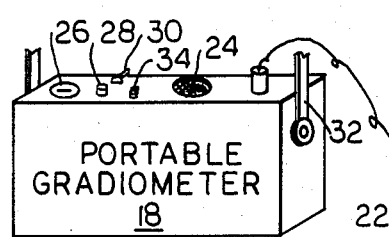
FIG. 3 depicts a detailed and somewhat diagramatic view of the gradiometer depicted in FIG. 1 utilized to detect and locate a misplaced tool inside the cowling of a jet engine on a flight line.

The system of the present invention is illustrated in FIGS. 1, 2, and 3. Therein, a hand tool 12 typically of high quality tool steel alloy, is initially subjected to a magnetizing field by a magnetizer 14. The magnetizer 14 may be a permanent magnet of high flux density or it may be a direct current electromagnet powered by a direct current supply operated from the primary power source. In any event, the magnetizer 14 is a portable item available for field magnetization of tools and other items. The tool 12 is initially subjected to a sufficient magnetizing field so that it is provided with a residual magnetic flux preferably of about fifty oersteds. The tool 12 is provided with residual magnetism as an initial step before it is used in the vicinity in which it would constitute a hazard if misplaced or left behind.

A portable, self-contained, battery operated gradiometer 18 is depicted in FIGS. 1 and 3. Therein the gradiometer includes a housing, a probe 20, and a cable 22 interconnecting the probe 20 with the housing. The loudspeaker 24, and a meter 26, a sensitivity control 28 and a function switch 30 are provided within the housing of the gradiometer 18. The shoulder strap 32 enables the unit 18 to be carried comfortably by an operator in the field, as depicted in FIG. 1.

Figure 9:
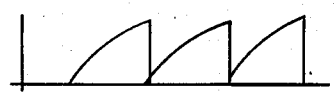
FIG. 9 depicts a diagramatic plan view of the magnetic fields generated by the probe shown in FIG. 3.
Figure 9:
Figure 9:
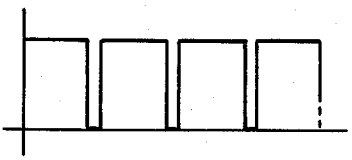
Figure 9:
Figure 9:
Figure 9:
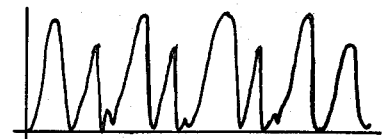
Figure 9:
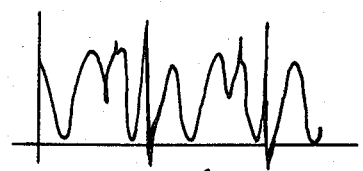
Figure 9:
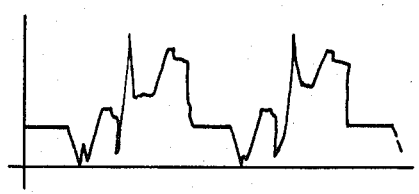
Figure 9:
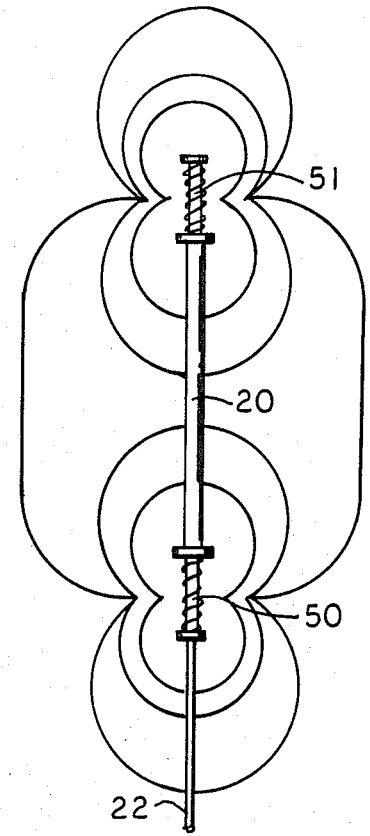

The operation of the gradiometer 18 is illustrated diagramatically in FIGS. 1 and 3. Therein, the exemplary tool 12 has been misplaced and has been mistakenly left behind a shroud panel 36 of an aircraft jet engine 38. Unless the tool 12 is located and removed, it presents a significant hazard to the engine 38. As shown in FIGS. 1 and 3, the probe 20 which is characterized by a known field pattern, depicted in FIG. 9, is brought into proximity of the residual gradient shown by flux lines 40 in FIG. 3. As shown in FIG. 3, the flux lines 40 pass through the nonferrous shroud 36 of the jet engine. When the probe 20 comes into the proximity with the flux lines 40, the flux disturbs a balanced electromagnetic field of the probe and this disturbance is detected and used to generate an alarm signal which is communicated to the operator through a tone emanating from the loudspeaker 24 or from headphones (not shown). A visual indication of the presence of the tool 12 may be also provided by the meter 26. As the probe intersects additional flux lines 40, the tonal quality and amplitude of the signal emanating from the loudspeaker increases, so that by manipulating the probe and knowing its particular field pattern, it is possible to locate with precision the missing tool 12.

Preferably, the gradiometer 18 functions such that the unit is silent unless a low level magnetic field gradient intersects the field of the probe 20. In that event, an imbalance occurs and harmonics of the driving current supplied to the probe 20 are amplified and provide a relative indication of flux strength and direction.

Figure 7:
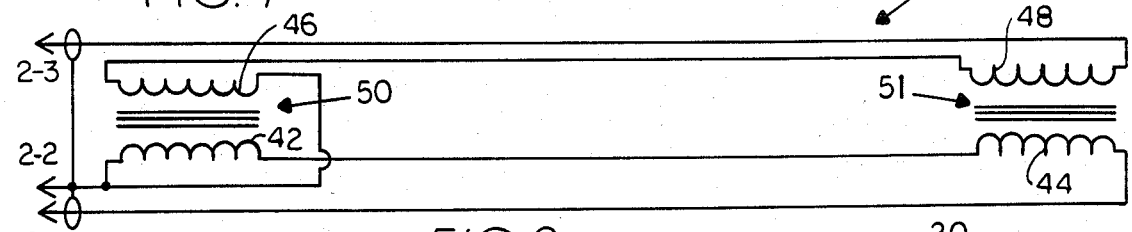
FIG. 7 depicts a schematic circuit diagram of the probe depicted in FIG. 3.
Figure 8:
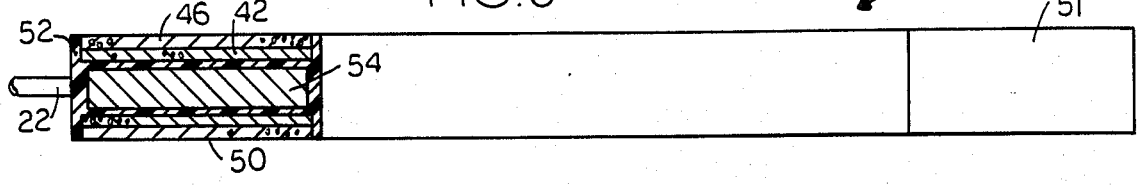
FIG. 8 depicts a side elevational view in partial section of the probe depicted in FIG. 3.

Referring to FIGS. 7 and 8, the probe 20 is comprised of two opposed sense flux transformers 50 and 51. The transformer 50 includes a drive coil 42 and a pick-up coil 46. The transformer 51 includes a drive coil 44 and a pick-up coil 48. The drive coils 42 and 44 are each formed of sixteen hundred turns of #38 drawn copper wire and the pick-up coils 46 and 48 are each formed of four hundred turns of #32 drawn copper wire. Each transformer 50, 51 are formed on a ceramic bobbin 52 having a hollow core. A one mil sheet of Permalloy 80, a particular type of high-permeability iron-nickel magnetic alloy, is spiral wrapped and emplaced within the ceramic bobbin 52 to provide a high-permeability core 54. A ceramic tube and core product, under part number 80195-1D-000-3, manufactured by Magnetics, Division of Spang Industries Inc., Butler, Pa., works well for the bobbin 52 and core 54 of each transformer 50 and 51. The drive coil 42 and the pick-up coil 46 are wound in layers as depicted in the sectional view of FIG. 8. The coils are about three inches long and are spaced apart about seven and a half inches.

A voltage is induced in each of the pick-up coils 46 and 48 by means of a time varying magnetic flux induced in the core 54 of each transformer 50, 51 by the drive coils 42 and 44. Each core 54 saturates before the peak drive field is reached. Consequently, the field sensed by each pick-up coil 46, 48 changes only during a short time interval in each flux cycle. As a result, a series of voltage pulses or spikes is induced in the pick-up coils 46, 48. The presence of an external magnetic field causes a given core 54 to saturate sooner or later in a drive cycle, and displaces the voltage pulses induced in the pickup coils 46 and 48. The pick-up coils 46, 48 are connected in opposite magnetic pole sense, and produce voltage pulses of opposite polarity. Consequently, if both cores 54 of the transformers 50 and 51 are immersed in equal external magnetic fields, the voltage pulses induced in the pick-up coils 46 and 48 are equal in magnitude and time and opposite in polarity so they cancel one another. However, if the cores 54 of the transformers 50 and 51 are immersed in unequal fields, as for example near a small magnetic field emanating from a misplaced item 12, the voltage pulses then induced in the pick-up coils 46, 48 will not cancel.

This imbalance will be first perceived as a change in tone quality in output audio signal, and it results from the extra harmonics in the fourier spectrum of the uncancelled voltage spikes. If the field strength is sufficiently different, the almost total saturation of one core 54 of one transformer 50 or 51 will cause that particular cores pick-up coil 46 or 48 to give almost no signal, so that the signal from the other transformer 51 or 50 will become significantly increased in amplitude. Thus, one can aurally sense the presence of gradients of the local magnetic field, and a sensitive meter connected through a band pass filter to select harmonics of the drive signal, can detect the change in frequency spectrum which results from these gradients.

Figure 4:
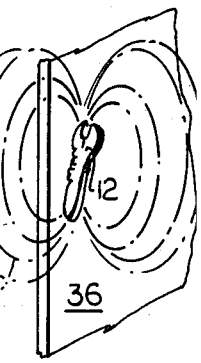
FIG. 4 depicts a schematic circuit diagram of a pulse generator within the gradiometer depicted in FIG. 3.
Figure 4:
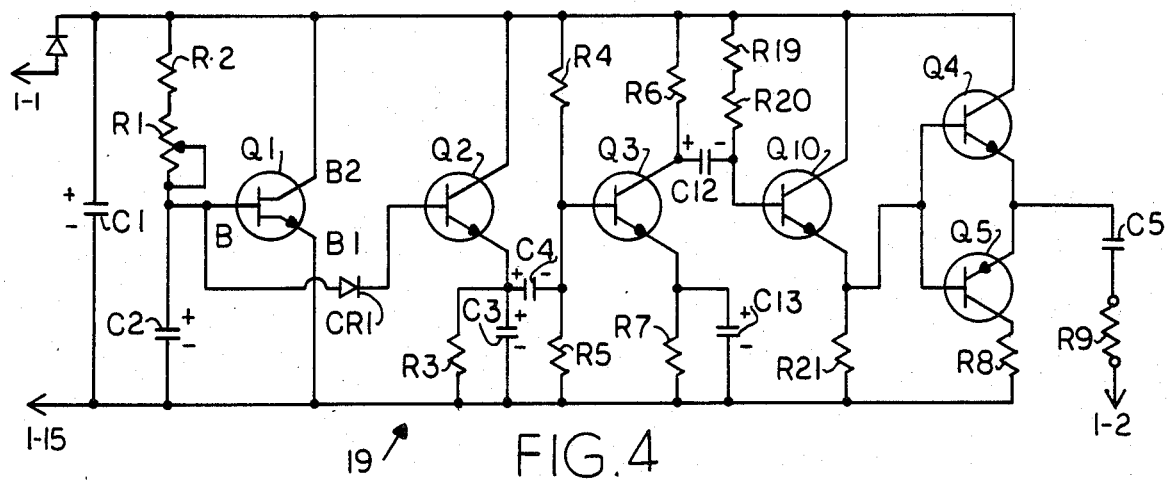

Referring now to FIG. 4, the pulse generator includes a unijunction transistor oscillator Q1 configured to oscillate at approximately five hundred Hertz. Exact frequency of oscillation is set by adjustment of the potentiometer R1. The output waveform of the oscillator Q1 is depicted in the waveform diagram of FIG. 10. The output signal from the oscillator Q1 is withdrawn at the base B thereof and passed through a diode CR 1 to the base of an emitter follower transistor Q2. The signal appearing at the emitter of the transistor Q2 is depicted in FIG. 11. The transistor Q3 is configured to operate as a clipper and provides a waveform at the collector as depicted in FIG. 12. The transistor Q10, configured as an emitter follower, drives transistors Q4 and Q5 which are configured as a push pull complementary pair. The waveform at the emitter of Q10 and at the bases of Q4 and Q5 is depicted in FIG. 13. The output from transistors Q4 and Q5 provided at jackpin 1-2 is depicted in FIG. 14. Jackpin 1-1 supplies operating voltage to the drive generator 19, and jackpin 1-15 is a ground return.

Figure 5:
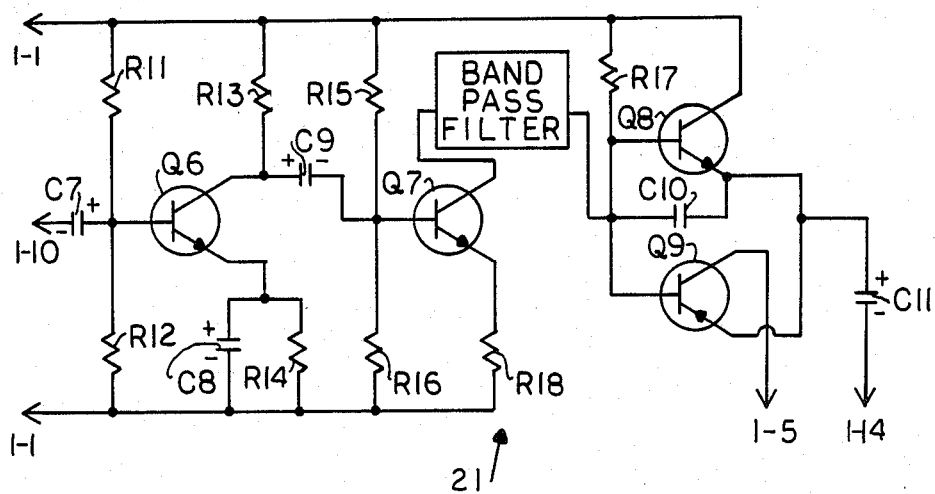
FIG. 5 depicts a schematic circuit diagram of a detector within the gradiometer in FIG. 3.

Referring now to FIG. 5, the detector 21 includes a connection from jackpin 1-10 through a blocking capacitor C7 to the transistor Q6 which is configured as a high gain amplifier. The signal at the collector of the transistor Q6 is depicted in FIG. 15 and is supplied to the base of a transistor amplifier-driver Q7 whose output is depicted in the waveform diagram of FIG. 16. Transistors Q8 and Q9 are connected to the output of the driver Q7 through an optional band pass filter, and they provide a push pull output amplifier having an output waveform depicted in FIG. 17. The audio output from the amplifier pair Q8 and Q9 is connected to jackpin 1-14.

Figure 6:
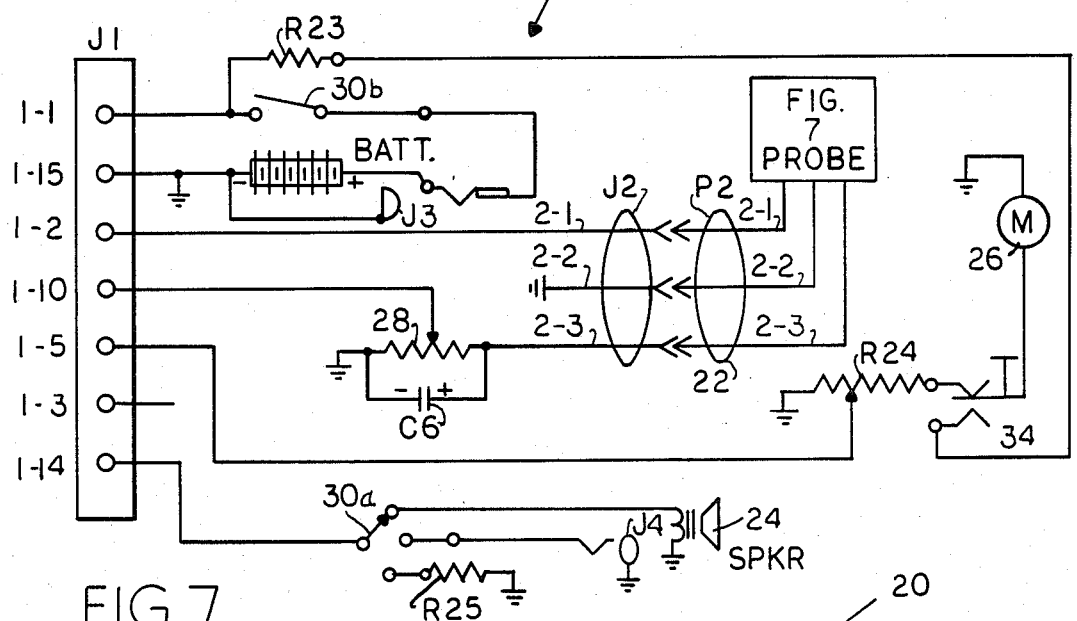
FIG. 6 depicts a schematic circuit diagram and block diagram of controls and connections of the portable gradiometer depicted in FIG. 3.

Referring now to FIG. 6, the common control and power circuitry includes a plug J1 which mates with an edge connector upon which the drive generator 19 and detector 21 are fabricated. Pin 1-1 supplies primary power from a battery through a switch contact 30b. Jack J3 provides a battery charging connection to recharge the battery which is preferably a series of nicad cells configured to provide 18 volts of direct current. Pin 1-2, from the drive generator 19 depicted in FIG. 4, is connected through a jack and plug combination J2-P2 to the drive coils 42, 44 in the probe 20. The signal induced in the pick-up coils 46 and 48 of the probe 20 is delivered via the same plug and jack combination to the gain control potentiometer 28, the wiper of which provides the connection 1-10 at jack J1 to the detector circuit 21 depicted in FIG. 5. A meter 26 is connected through potentiometer R24 and pin 1-5 to the collector of Q9 to enable the operator to monitor visually the gain of Q8 and Q9 and thereby provide a relative indication of field strength. A pushbutton 34 switches the meter 26 from the meter output of the detector to a battery check connection. The switch 34 is a momentary return pushbutton and is in normal connection with the collector of Q9. The output from the detector at pin 1-14 is supplied to the function switch 30A and is connected between the loudspeaker 34, a jack J4 and for a headphone, and a load resistor R25.

Periodically, all of the tools 12 and other items will be checked for residual magnetism with the gradiometer 18 to be sure that they have not become degaussed through exposure t, e.g., strong AC fields. The checking of the tools may be readily accomplished by scanning them with a probe 20 to confirm residual magnetism in each item before it is taken into the operating environment.

The following table sets forth the values of the components depicted in FIGS. 4, 5, and 6:

| TABLE OF COMPONENTS | | |
|---|---|---|
| Transistors | Resistors ½ Watt | |
| Q1 2N4871/HEP S 9002 | R1 - 50K POT | R13 - 15K |
| Q2 MPS - A06 | R2 - 2.7K | R14 - 3.3K |
| Q3 MPS - A06 | R3 - 5.6K | R15 - 100K |
| Q4 MPS - A06 | R4 - 33K | R16 - 15K |
| Q5 MPS - A56 | R5 - 6.8K | R17 - 33K |
| Q6 2N3903/2N222A | R6 - 4.7K | R18 - 470 |
| Q7 2N3903/2N222A | R7 - 470 | R19 - 100K |
| Q8 MPS - A06 | R8 - 120 | R20 - 47K |
| Q9 MPS - A56 | R9 - 680 | R21 - 4.7K |
| Q10 MPS - A06 | R10 - 1K POT | R22 - 10 watt |
| | R11 - 47K | R23 - 68K |
| | R12 - 6.8K | R24 - 200 POT |
| Capacitors | | |
| C1 | 100 uf | at 25 Volts DC |
| C2 | .33 | " |
| C3 | 1 | " |
| C4 | 1 | " |
| C5 | 1 | " |
| C6 | 3 | " |
| C7 | 1 | " |
| C8 | 10 | " |
| C9 | 1 | " |
| C10 | .015 | 100 Volts DC |
| C11 | 6 | 25 Volts DC |
| C12 | 1 | " |
| C13 | 22 | " |
| CR1 | 10D2/ECG116 | |
| CR2 | 10D2/ECG116 | |

Having thus described an embodiment of the invention, it will now be appreciated that the objects of the invention have been fully achieved, and it will be understood by those skilled in the art that many changes in construction and circuitry and widely differing embodiments and applications of the invention will suggest themselves without departure from the spirit and scope of the invention. The disclosures and the description herein are purely illustrative and are not intended to be in any sense limiting.

We claim:
1. Portable apparatus for detecting and locating residually magnetized items in preference to similar non-magnetized items, comprising:
   a hand held probe including:
   a plurality of axially spaced apart transformer means each transformer means having a primary and a secondary wound about a separate core having high permeability characteristics, each primary connected in series with another thereof, and each said transformer means aligned in proximity with another thereof, as to develop a common magnetic field upon excitation of the primary windings thereof, each secondary thereof connected in series in polar opposition,
   driving generator means connected to said primaries for generating a limited duty cycle, audio frequency drive current and passing it through each said primary, said drive current being of sufficien magnitude to cause each core to saturate before peak drive current is reached and to develop said common magnetic field, harmonic audio frequency energy detector means connected to said secondaries for detecting changes in amplitude of harmonics of said drive current induced as voltage pulses in one or another of said secondaries when said field becomes unbalanced by the presence of a weak residual magnetic field emanating from a said residually magnetized item and for reproducing as proportional sound signals said detected changes to provide a relative indication of direction and proximity of said item.

2. Self-contained apparatus for detecting and locating residually magnetized items, and for distinguishing them from other non-magnetized ferrous and non-ferrous metallic items, said apparatus comprising:

a sensor probe including:

a plurality of high permeability, saturable cores aligned with and spaced apart along a common axis of said probe;

a plurality of drive coils, each coil being wound on a said core and connected in series to provide said cores in polar alignment;

a plurality of pickup coils, each being wound as a secondary of said drive coil and connected in series in polar opposition so that voltages induced therein from excitation of said drive coils are substantially equal in magnitude and time and substantially opposite in polarity as to be phase cancelling;

a control unit connected to said probe by an electrical cable and including:

pulsed driving-signal generator means connected to said series connected drive coils for providing an audio frequency drive current and passing it through each said drive coil at a level which saturates the core thereof so as to generate a plurality of magnetic fields and a common field in polar alignment;

detector means connected to said pickup coils for detecting audio frequency harmonics of said pulsed audio frequency resulting from imbalances in phase cancellation induced in said pickup coils when said fields are disturbed by the presence of said residual magnetic field emanating from the item to be located, and for indicating the direction and proximity of said object by amplifying and reproducing as a proportional sound wave said detected audio frequency harmonics.

3. The apparatus set forth in claim 2 wherein said hand held probe comprises two said cores and wherein the axial length of each said core is in a range not greater than twenty five percent (25%) of the total length between far ends of said cores along said axis, and wherein the axial length between near ends of said cores is no less than fifty percent (50%) of said total length.

4. The apparatus as set forth in claim 2 wherein the ratio of turns between a said drive coil and its said pickup coil is generally four to one.

5. The apparatus set forth in claim 2 wherein each said core is approximately three inches in axial length, each drive coil comprises approximately 1600 turns adjacent said core, and each said pickup coil comprises approximately 400 turns outwardly adjacent said drive coil.

6. The apparatus set forth in claim 5 wherein said generator means provides an audio frequency pulse of approximately 500 Hertz having a duty cycle not greater than approximately thirty three percent (33%).

7. A method for detecting and locating items characterized by a residual magnetic field and the like, comprising the steps of:

a. providing a balanced common magnetic field of known field pattern by exciting a plurality of pole aligned, spaced apart, series connected primary windings of a plurality of saturated core electromagnets with a limited duty cycle audio frequency drive current in a hand held probe, b. manipulating said magnetic field providing probe in the vicinity of a residually magnetized field so as to cause it to upset said balanced common magnetic field even at substantial distances therefrom, c. detecting amplitude of non-phase-cancelling audio frequency harmonics of said drive current which are induced in pickup windings of said electromagnets only when said balanced field is upset by proximity of said residually magnetized field, and reproducing as a relative audio sound signal said detected amplitude, and d. manipulating said probe in a way that aids location of said item by said known characteristics of said balanced field and the relative amplitude of said audio sound signal.

* * * * *